(12) United States Patent
Atsumi et al.

(10) Patent No.: US 6,300,841 B1
(45) Date of Patent: Oct. 9, 2001

(54) ATOMIC OSCILLATOR UTILIZING A HIGH FREQUENCY CONVERTING CIRCUIT AND AN ACTIVE, LOW-INTEGRAL-NUMBER MULTIPLIER

(75) Inventors: Ken Atsumi; Hideyuki Matsuura; Yoshifumi Nakajima, all of Sendai; Yoshito Koyama, Kawasaki; Koji Nakamuta, Kawasaki; Minoru Sakai, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/536,525

(22) Filed: Mar. 28, 2000

(30) Foreign Application Priority Data

Jul. 22, 1999 (JP) .................................................. 11-207395

(51) Int. Cl.$^7$ ...................................................... H03L 7/26
(52) U.S. Cl. .................................. 331/94.1; 331/3; 331/74
(58) Field of Search ............................ 331/3, 94.1, 46, 331/47, 50, 53, 74

(56) References Cited

U.S. PATENT DOCUMENTS 4,425,515 * 1/1984 Larson ................................. 307/268
5,606,291 * 2/1997 Verbanets ............................... 331/3

FOREIGN PATENT DOCUMENTS 7-336220    12/1995  (JP) .

* cited by examiner

Primary Examiner—David Mis
(74) Attorney, Agent, or Firm—Helfgott & Karas, P C

(57) ABSTRACT

In an atomic oscillator, a high-frequency converting circuit converts the output of a standard oscillator into a high frequency signal such that the frequency of the high frequency signal multiplied by a low natural number equals an atomic resonant frequency signal. The high frequency signal is then multiplied by a low natural number in an active, low-natural-number multiplier circuit to convert the output frequency of the standard oscillator into a resonant frequency to be input to the atomic oscillator. The result is that, without using a passive, high-natural-number multiplier circuit, such as a varactor diode, which is expensive, it is possible to convert the output frequency of the standard oscillator into a resonant frequency signal of a rubidium atom, thus downsizing the circuits of the atomic oscillator and reducing the term and cost of manufacture.

27 Claims, 8 Drawing Sheets

ATOMIC OSCILLATOR UTILIZING A HIGH FREQUENCY CONVERTING CIRCUIT AND AN ACTIVE, LOW-INTEGRAL-NUMBER MULTIPLIER

BACKGROUND OF THE INVENTION

1. Field of the Invention

The present invention relates to an atomic oscillator suitable for use as a standard source in broadcasting, a clock source in a digital synchronous network, etc.

2. Description of the Related Art

FIG. 6 of the accompanying drawings is a block diagram schematically showing a conventional rubidium atomic oscillator (hereinafter simply called "atomic oscillator"). The atomic oscillator 101 is divided into chiefly three blocks: a high frequency (HF) block 102 as a first block, an optical microwave unit (OMU) 103 as a second block, and a low frequency (LF) block 104 as a third block.

The HF block 102 not only generates an output frequency signal to be supplied to outside as the output of the atomic oscillator 101, but also produces from the output frequency signal a signal from which a microwave {rubidium resonant (transitional) frequency signal of approximately 6.8346 GHz} to be produced in the OMU 103 originates. For this purpose, in an example, the HF block 102 essentially includes a voltage-controlled crystal oscillator (VCXO) 120 as a standard oscillator, a first LC tank circuit 121, a phase modulator circuit 122, a second LC tank (resonator) circuit 123, an amplitude modulator circuit 124, a matching circuit 125, and a frequency synthesizer 126.

The VCXO 120 generates an output frequency signal (e.g., 10 MHz) to be supplied to outside as the output of the atomic oscillator. In an example, each of the first and second LC tank (resonator) circuits (hereinafter simply called "tank circuit") 121, 123 includes a non-illustrated transistor amplifier, and a tank filter composed of a coil (L) and a capacitor (C) in parallel; the individual tank circuit 121, 123 varies a bias of the transistor amplifier to distort an input frequency signal and then samples from the resultant signal a multiplied-frequency component, thus multiplying the input frequency signal by a predetermined natural number (3 for example). Firstly in the first tank circuit 121, the output frequency signal (10 MHz for example) of the VCXO 120 is multiplied by a natural number (3, for example); this is, 10 MHz×3=30 MHz. Then in the second tank circuit 123, the resultant output frequency signal of 30 MHz is multiplied by the same natural number; this is, 30 MHz×3=90 MHz.

In the meantime the phase modulator circuit 122 modulates the output (30 MHz) of the first tank circuit 121 in phase (or in frequency) using the output (phase modulation signal fm of 155 Hz, for example) of a below-described low frequency oscillator 141 of the LF block 104. The amplitude modulator circuit 124 modulates the output (90 MHz) of the second tank circuit 123 by the output (approximately 5.3101 HMz) of the frequency synthesizer 126.

The frequency synthesizer 126, as is well known in the art, is a kind of phase-locked loop (PLL) circuit equipped with a non-illustrated voltage-controlled oscillator (VCO) for generating a frequency signal for the above-mentioned amplitude modulation (amplitude modulation signal of approximately 5.3101 MHz). The output of the VCO is compared in phase with the output of the VCXO 120, and the output frequency (amplitude modulation frequency) of the VCO is controlled in such a manner that the output of the VCO is synchronized in phase with that of the VCXO 120.

The PLL-type frequency synthesizer 126 is also equipped with a variable frequency divider (programmable frequency divider) so that fine adjustments of the above-mentioned amplitude modulation frequency can be made in accordance with frequency setting information given from an external source.

Further, the matching circuit 125 takes an impedance matching between the HF block 102 and the OMU 103 so that the signal (90 MHz) amplitude-modulated in the amplitude modulator circuit 124 is input to the OMU 103 via the matching circuit 125 as a high frequency signal from which the above-mentioned resonant frequency signal originates.

Then the OMU 103, which is a box-shaped atomic resonator, detects and outputs a signal (atomic resonance signal) when a rubidium atom in the resonator box is resonated (transited) as a microwave to be a resonant (transitional) signal of a rubidium atom occurs in the resonator box. For this purpose, as shown in FIG. 6, the OMU 103 includes a rubidium lamp 131, a resonance cell 133 in which a rubidium atom is charged (loaded), a cavity resonator 132 equipped with a varactor diode 134 and a photo diode (PD), and a pre-amplifier (PA) 136. The resonator box of the OMU 103 is treated with magnetic shielding 130 so that resonance of rubidium atom is prevented from being influenced by a possible magnetic field due to a peripheral circuit.

The above-mentioned rubidium lamp 131 is a lamp for emitting light (high frequency discharge) by exciting a coil 1312 with the output of an exciter 1311, thereby irradiating the light to a resonance cell 133 in the cavity resonator 132.

The varactor diode (high-natural-number multiplier) 134 produces in the cavity resonator 132 a microwave (resonant frequency signal) having an amplitude-modulated component ±5.3101 MHz at either side about 90×76=6.840 GHz by multiplying the output (phase-and amplitude-modulated high frequency signal of 90 MHz) by a high natural number (76 for example) of the matching circuit 125; the lower part of this microwave frequency (6.840 GHz–5.3101 MHz= 6.8346 GHz) is a value approximating to the resonant frequency of rubidium atom. The cavity resonator 132 is tuned to approximately 6.8 GHz (designed in such a manner that resonance will occur under a microwave of approximately 6.8 GHz).

Since the requested output frequency of the VCXO 120 is oddlessly 10 MHz, simply multiplying such output frequency 10 MHz using the first and second tank circuits 121, 123 and the varactor diode 134 does not suffice to produce the resonant frequency of rubidium atom (approximately 6.8346 GHz). Consequently in the conventional rubidium atomic oscillator 101, the input signal to the OMU 103 is modulated in amplitude whereupon the amplitude-modulated component of the resultant input signal is multiplied.

The photo diode 135 receives the light emitted from the rubidium lamp 131 and traveling through the resonance cell 133 and outputs an electrical signal in accordance with the quantity of the received light as an atomic resonance signal. Assuming that a microwave frequency produced by the varactor diode 134 coincides with the resonant frequency (approximately 6.8346 GHz) of rubidium atom, an atomic resonance will occur so that the light from the rubidium lamp 131 will be absorbed in part by the rubidium atom in the resonance cell 133, resulting in reduced quantity of the received light.

Accordingly an electrical signal (atomic resonance signal) to be output from the photo diode 135 has information about a difference (error frequency) between the microwave frequency, which is produced in the cavity resonator 132, and the resonant frequency of rubidium atom (approximately 6.8346 GHz). The pre-amplifier 136 serves to amplify the output of the photo diode 135 to an appropriate level in advance.

The LF block 104 serves as a servo circuit which detects the above-mentioned frequency-error information (error signal) from the atomic resonance signal output from the OMU 103 and which then controls the output frequency of the VCXO 120 in such a manner that the detected error signal is minimal (ideally 0). In an example, the LF block 104 is composed of a low-frequency voltage control oscillator (VCO) 141, an amplifier 142, a synchronous detector 143, and an integrator 144.

The low-frequency VCO 141 generates a phase modulation signal fm for the phase modulator circuit 122 and, in the meantime, the amplifier 142 amplifies an atomic resonance signal from the OMU 103 up to an appropriate level. And the synchronous detector 143 takes a synchronous detection on the atomic resonance signal, which is amplified by the amplifier 142, with the output (phase modulation signal fm) of the low-frequency VCO 141 to thereby detect an error signal.

The integrator 144 integrates the error signal, which is detected by the synchronous detector 143, to convert the error signal into a d. c. voltage value; this d. c. voltage is to be supplied (applied) to the VCXO 120 as a control voltage to control (correct) the output frequency thereof.

The operation of the conventional atomic oscillator 101 will now be described.

First of all, the output (10 MHz) of the VCXO 120 is input, as the output of the rubidium atomic oscillator 101, to both the first tank circuit 121 of the HF block 102 and the frequency synthesizer 126. The frequency synthesizer 126 then produces a signal of approximately 5.3101 MHz, which is synchronized in phase with the output frequency of the VCXO 120, as an amplitude modulation signal for the amplitude modulator circuit 124.

Meanwhile, the first tank circuit 121 multiplies the input signal (10 MHz) by 3 and outputs the resultant input signal (10 MHz×3=30 MHz). The output of the first tank circuit 121 is input to the phase modulator circuit 122 where the output of the first tank circuit 121 is modulated in phase by the output (phase modulation signal fm) of the low-frequency VCO 141 in the LF block 104. Then the output of the phase modulator circuit 122 is further multiplied by 3 (30 MHz×3=90 MHz) in the second tank circuit 123, whereupon the resultant output of the phase modulator circuit 122 is modulated in amplitude by the output (amplitude modulation signal) of the frequency synthesizer 126 in the amplitude modulator circuit 124 and is then input to the OMU 103 via the matching circuit 125.

Subsequently, in the OMU 103, the input signal from the matching circuit 125 is multiplied by 76 (high natural number) by the action of the varactor diode 134 in the cavity resonator 132 so that a microwave of approximately 6.840 GHz occurs in the cavity resonator 132, causing atomic resonance in the cavity resonator 132.

At that time, if the lower part of the amplitude-modulated component about the microwave frequency occurred by the action of the varactor diode 134 coincides with the resonant frequency of rubidium atom (6.8346 GHz), atomic resonance will occur so that the light from the rubidium lamp 131 will be absorbed by the rubidium atom in the resonance cell 133, thus resulting in a drastically reduced quantity of light to be detected by the photo diode 135 (see a point A in FIG. 7).

Otherwise if the lower part of the amplitude-modulated component is off even by little the resonant frequency of rubidium atom (6.8346 GHz) the quantity of light to be detected by the photo diode 135 will drastically increase (see points B and C in FIG. 7) because Q value is very small (500 Hz for example) compared to the resonant frequency, as shown in FIG. 7.

Thus the quantity of light (electrical signal) detected by the photo diode 135 is input to the LF block 104 via the pre-amplifier 136. At that time, the output of the pre-amplifier 136, which has been obtained by modulating in phase the microwave generated in the cavity resonator 132, is a signal (atomic resonance signal) inverted in phase by 180° about the resonant frequency near 6.8346 GHz as schematically shown in (a) of FIG. 8. A, B and C in (a) of FIG. 8 represent the respective output waveforms of the pre-amplifier 136 with respect to the microwave frequencies at points A, B and C in FIG. 7.

The LF block 104 converts the output (atomic resonance signal) of the pre-amplifier 136 to an appropriate level at the amplifier 142 and then takes a synchronous detection at the synchronous detector 143 by the phase modulation frequency fm (see (b) of FIG. 8 for example) from the low frequency oscillator 141 to produce an error signal (see (c) of FIG. 8).

When this error signal is converted into a d. c. voltage by integrating the error signal by the integrator 144, various voltage values of 0 (zero), − (negative) and + (positive) will occur at point A (there is no difference or error between the microwave frequency and the resonant frequency), point B (the microwave frequency is higher than the resonant frequency) and point C (the microwave frequency is lower than the resonant frequency), respectively; the occurred voltage is to be applied to the VCXO 120 as a control voltage therefor.

The output frequency of the VCXO 120 is thereby controlled (corrected) in such a manner that a microwave frequency (the lower part of the amplitude-modulated component) to be produced in the cavity resonator 132 coincides with the resonant frequency of rubidium atom (6.8346 GHz); this is, the output frequency of the VCXO 120 is stabilized with the degree of stability of the resonant frequency of rubidium atom. With this conventional rubidium atomic oscillator 101, it is possible to produce a very high-stability output frequency.

In the above-mentioned example, adopting a natural number "3" as a multiplier of each of the first and second circuits 121, 123 and a two-digit natural number "76" as a multiplier natural number of the varactor diode 134 (namely, a signal of 90 MHz obtained by multiplying the output of the VCXO 120 by 9 (3×3) is modulated in amplitude, and the resulting frequency is then multiplied by 76), the resonant frequency of rubidium atom is produced. Alternatively, even if the respective multipliers of the first and second tank circuits 121, 123 are "2" and "3" and the multiplier of the varactor diode 134 is "144" (namely, a signal of 60 MHz obtained by multiplying the output of VCXO 120 by 6 (2×3) is modulated in amplitude, and the resulting frequency is then multiplied by 144), it is possible to produce the same resonant frequency.

Further, the conventional rubidium atomic oscillator 101 produces, as its output frequencies (i.e., the output frequencies of the VCXO 120), various output frequencies (oddless frequencies in general) of 5 MHz, for example, other than that of 10 MHz, by merely changing the respective amplifiers, natural numbers, of the first tank circuit 121, the second tank circuit 123 and the varactor diode 134 in such a manner that a target microwave frequency to be finally produced in the cavity resonator 132 will coincide with the resonant frequency of rubidium atom, irrespective of the figure of the output frequency.

However, with the foregoing atomic oscillator 101, since the tank circuits 121, 123 for extracting a multiplied-frequency component from the input signal using a coil (L) and a capacitor (C) are used in order to multiply the output of the VCXO 120, it would be necessary to make tuning in accordance with a selected multiplier, i.e. a natural number, for every tank circuit during the manufacture of the atomic oscillator, causing a delay of term of manufacture and an increase of cost of manufacture.

Further, partly since the varactor diode 134 is a passive element, and partly since multipliers of the varactor diode 134 are "76" and "144", which are very high, strict adjustments would be essential to the matching circuit 125 of the HF block in order to produce a desired level of microwave in the cavity resonator 132. In addition, the varactor diode 134 itself is an expensive element. These facts would result in a delay of term of manufacture and an increase of cost of manufacture.

Furthermore, in the conventional rubidium atomic oscillator 101, since the output frequency of the VCXO 120 multiplied by a natural number does not coincide directly with the resonant frequency of rubidium atom (6.8346 GHz), it would require the frequency synthesizer 126 and the amplitude modulator circuit 124. Yet, in order to produce an optimum resonant frequency signal of rubidium atom, strict adjustments in modulation to the amplitude modulator circuit 124 also would be essential.

With the foregoing conventional rubidium atomic oscillator 101, partly since a complex construction is necessary to convert the output frequency of the VCXO 120 into the resonant frequency of rubidium atom, and partly since adjustments of the complex construction are not easy, it would be considerably uncompetitive in downsizing of circuits, shortening the term of manufacture, and reducing the cost of manufacture.

SUMMARY OF THE INVENTION

With the foregoing problems in view, it is an object of the present invention to provide an atomic oscillator which can produce from the output frequency signal of a standard oscillator a high-frequency signal as multiplied by a low natural number so as to be equal to the atomic resonant frequency, thus resulting in downsizing of circuits, and reduction of the term and cost of manufacture.

In order to accomplish the above object, according to the present invention, there is provided an atomic oscillator comprising:

an atomic resonator having a desired atom for outputting an atomic resonant signal having frequency-error information in response to a resonant frequency signal which causes the atom to resonate;

a standard oscillator for producing an output frequency to be supplied to outside as the output of the atomic oscillator, the output frequency being controlled in such a manner that the frequency-error information of the atomic resonant signal is minimal;

a high-frequency converter circuit for converting the output of the standard oscillator into a high frequency signal such that the high frequency signal multiplied by a predetermined low natural number, as a multiplier, equals to the resonant frequency signal; and an active, low-integral-number multiplier circuit for producing the resonant frequency signal, which is to be input to the atomic resonator, by actively multiplying the high frequency signal from the high-frequency converter circuit by the low natural number.

With this arrangement, partly since the high-frequency converter circuit converts the output of the standard oscillator into a high frequency signal such that the high frequency signal multiplied by a predetermined low natural number, as a multiplier, equals to the resonant frequency signal, and partly since the high frequency signal is multiplied by the active low-natural-number multiplier circuit having the low natural number, as a multiplier, to produce a resonant frequency signal, which is to be input to the atomic resonator, it is possible to produce a desired resonant frequency without using a passive multiplier circuit such as an LC tank circuit, which utilizes a coil or a capacitor, or a varactor diode.

Accordingly it is unnecessary to make adjustment (tuning) such as impedance matching between the low-natural-number multiplier circuit and the atomic resonator (realizing a tuning-free circuit). It is also unnecessary to utilize modulating amplitude, as conventional, in production of a resonant frequency of rubidium atom. These features enable downsizing of the atomic oscillator and reduction of the term and cost of its manufacture, realizing the manufacture of a smaller-sized, more inexpensive atomic oscillator in a shorter term as compared to the conventional art.

DESCRIPTION OF THE PREFERRED EMBODIMENT(S)

(A) Description of Aspect of the Invention

An aspect of the present invention will now be described with reference to the accompanying drawings.

Figure 1:
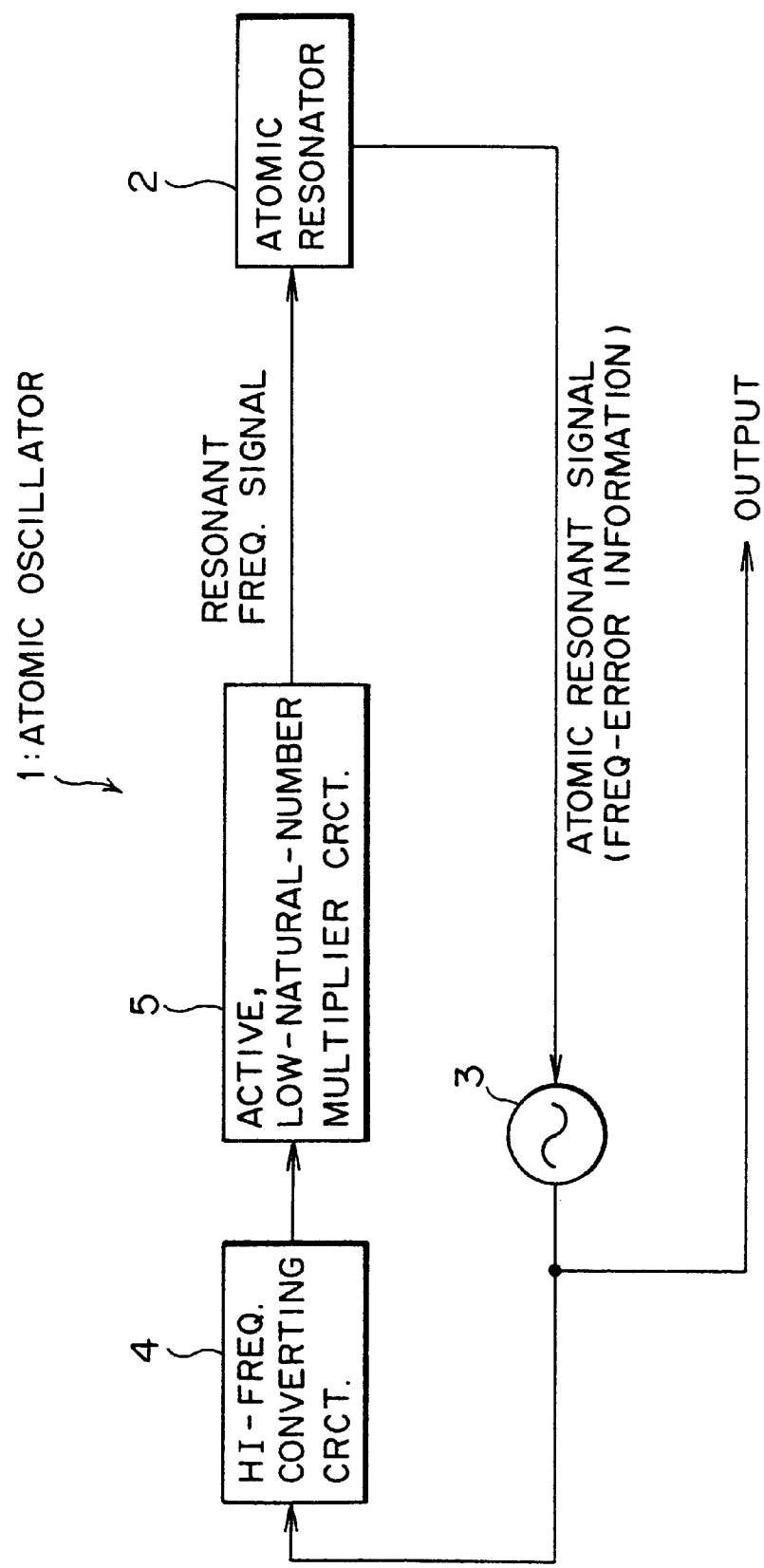
FIG. 1 is a block diagram schematically showing an aspect of the present invention.

FIG. 1 is a block diagram schematically showing the aspect of the present invention. As shown in FIG. 1, an atomic oscillator 1 of the present invention comprises an atomic resonator 2, a standard oscillator 3, a high-frequency converter circuit 4, and an active, low-natural-number multiplier circuit 5.

The atomic resonator 2 has a desired atom therein and outputs an atomic resonant signal carrying frequency-error information in response to a resonant frequency signal which causes the atom to resonate. The standard oscillator 3 produces an output frequency to be supplied to outside as the output of the atomic oscillator 1, controlling the output frequency in such a manner that the frequency-error information of the atomic resonant signal is minimal.

The high-frequency converter circuit 4 converts the output of the standard oscillator 3 into a high frequency signal such that the high frequency signal multiplied in frequency by a predetermined low natural number equals to the resonant frequency signal. The active, low-natural-number multiplier circuit 5 is given the low natural number as a multiplier to produce the resonant frequency signal, which is to be input to the atomic resonator 2, by actively multiplying the high frequency signal from the high-frequency converter circuit 4 by the low natural number.

In the atomic oscillator 1 thus constructed, the high-frequency converter circuit 4 converts the output of the standard oscillator 3 into a high frequency signal such that the high frequency signal multiplied by a predetermined low natural number equals to the resonant frequency signal. Then the high frequency signal is actively multiplied by the low-natural-number multiplier circuit 5, which is given a low natural number as a multiplier to produce a resonant frequency signal to be input to the atomic resonator 2. This construction enables the conversion of the output frequency of the standard oscillator 3 into the resonant frequency signal of the atom without using a passive, high-natural-number multiplier circuit such as a varactor diode, which would be essential to the prior art.

Accordingly, it is unnecessary to make adjustments (tuning), such as impedance matching, between the low-natural-number multiplier circuit 5 and the atomic resonator 2 (realizing a tuning-free circuit). It is also unnecessary to produce the resonant frequency signal of the atom, which would be conventionally performed by amplitude modulation. This results in downsizing of the atomic oscillator 1 and reduction of the term and cost of its manufacture, so that a small-sized, inexpensive atomic oscillator 1 can be shipped and delivered in a short term.

Alternatively the atomic oscillator 1 may include an output frequency converting section for converting the output frequency of the standard oscillator 3 into a desired output frequency of the atomic oscillator 1 so that a desired output frequency can be supplied to outside even when the output frequency of the standard oscillator 3 is selected in view of the frequency of the resonant frequency signal. In this alternative form, the atomic oscillator 1 can generate an output frequency signal in a stable manner as the users' demands arise.

Assuming that the low natural number as a multiplier is 3 or 4, an active, low-natural-number multiplier circuit, which is good in multiplication characteristics, can be applied to minimize loss of the high-frequency signal during the multiplication, thus improving the performance of the atomic oscillator 1 to a great extent.

Further, the high-frequency converter circuit 4 may be a high-frequency phase-locked loop (PLL) circuit which includes a high frequency oscillator for producing the high frequency signal, a phase comparator for comparing the output of the high frequency oscillator in phase with that of the standard oscillator, and a loop filter for producing a control signal, which is to be output to the high frequency oscillator, to filter the result of phase comparison of the phase comparator and to thereby synchronize the output of the high frequency oscillator in phase with that of the standard oscillator 3.

Given that the high-frequency converter circuit 4 is in the form of a high-frequency PLL circuit which includes a high-frequency oscillator, a phase comparator, and loop filter, it is unnecessary to use a multiplier circuit, such as a coil or a capacitor, which would be required to the prior art, in producing the high frequency signal from the output frequency of the standard oscillator 3. This enables adjustment-freeness and downsizing of the high-frequency converter circuit 4 so that a small-sized, inexpensive atomic oscillator 1 can be manufactured in a short term. Further, since the output of the high-frequency oscillator is always synchronized in phase with that of the standard oscillator 3 in high precision so that a resonant frequency signal as well as a highly stable high-frequency signal can be obtained, thus giving a great contribution to the improvement of performance of the atomic oscillator 1.

Furthermore, the atomic oscillator 1 may include a frequency-dividing and modulating section for dividing in frequency the output of the standard oscillator 3 and modulating the resultant output by a predetermined low-frequency modulation signal, and a synchronous detecting section for obtaining the frequency-error information by performing a synchronous detection on the atomic resonant signal, using the low-frequency modulation signal, to thereby produce a control signal to control the output frequency of the standard oscillator 3.

Since this construction is simple and makes it possible to detect the frequency-error information of the resonant frequency signal and then control the output frequency of the standard oscillator 3 such that the frequency-error information is minimal, it is possible to stabilize the output frequency of the standard oscillator 3 as highly as the degree of stability of the resonant frequency of atom, thus realizing a compact, high-performance, inexpensive atomic oscillator 1.

Alternatively the frequency-dividing and modulating section may include a first frequency divider for dividing in frequency the output of the standard oscillator 3, and a phase modulator for modulating in phase the output of the first frequency divider by the low-frequency modulation signal. In this alternative form, since the phase modulation can be performed on the output of the standard oscillator 3, which has been divided in frequency in advance to have a lower frequency, it is possible to facilitate the phase modulation and ensure an improved accuracy of phase modulation on the output of the standard oscillator 1.

In another alternative form, the frequency-dividing and modulating section may include a programmable frequency divider for dividing in frequency and modulating in phase the output of the standard oscillator by varying a clock cycle of the output frequency of the standard oscillator in accordance with the clock cycle of the low-frequency modulation signal based on a program set from outside the atomic oscillator. Accordingly it is unnecessary to provide the frequency divider and the phase modulator separately for frequency division and phase modulation of the standard oscillator 3, thus realizing a much smaller-sized atomic oscillator.

Further, the atomic oscillator 1 may include a second frequency divider for dividing in frequency the output of the standard oscillator to produce the low-frequency modulation signal so that a highly stable low-frequency modulation signal can be obtained without using a separate oscillator dedicated for generating the low-frequency modulation signal, thus giving a further contribution to downsizing of the atomic oscillator 1 and improvement of its performance.

In another alternative form, the atomic oscillator 1 may include a light emitting lamp for irradiating light to the atom in the atomic resonator 2, and a third frequency divider for dividing in frequency the output of the standard oscillator 3 to produce a drive signal driving the light emitting lamp, so that a highly stable drive signal to drive the light emitting lamp can be generated without utilizing a separate driving source (oscillator, for example) dedicated to the light emitting lamp, also giving a great contribution to downsizing of the atomic oscillator 1 and improvement of its performance.

Furthermore, the high frequency oscillator in the high-frequency PLL circuit may be a ring oscillator, which can digitize and can be regarded as one of the components of an LSI circuit. And the loop filter in the high-frequency PLL circuit may be a digital filter, which also can be regarded as one of the components of an LSI circuit. In other words, more parts can be regarded as components of an LSI circuit, realizing drastic downsizing of the atomic oscillator 1.

Embodiments of the present invention will now be described with reference to the accompanying drawings.

(B) Description of one Embodiment

Figure 2:
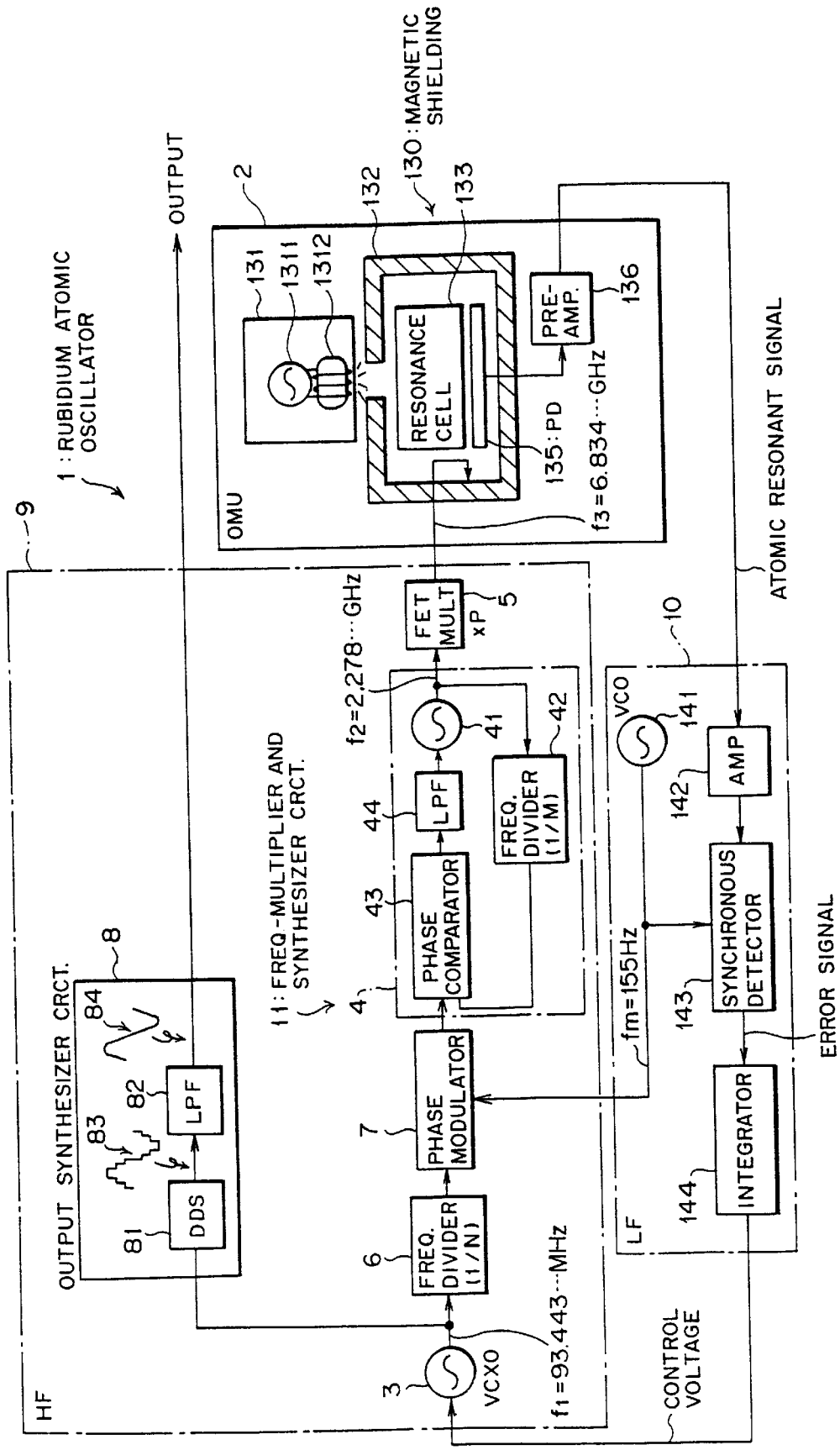
FIG. 2 is a block diagram schematically showing a rubidium atomic oscillator according to one embodiment of the present invention.

FIG. 2 is a block diagram schematically showing a rubidium atomic oscillator according to one embodiment of the present invention. Likewise the prior art oscillator shown in FIG. 6, the rubidium atomic oscillator (hereinafter simply called the atomic oscillator) comprises chiefly three main blocks: an OMU (optical microwave unit) 2 as a first block, a high-frequency (HF) block 9, as a second block, and a low-frequency (LF) block 10 as a third block.

Figure 6:
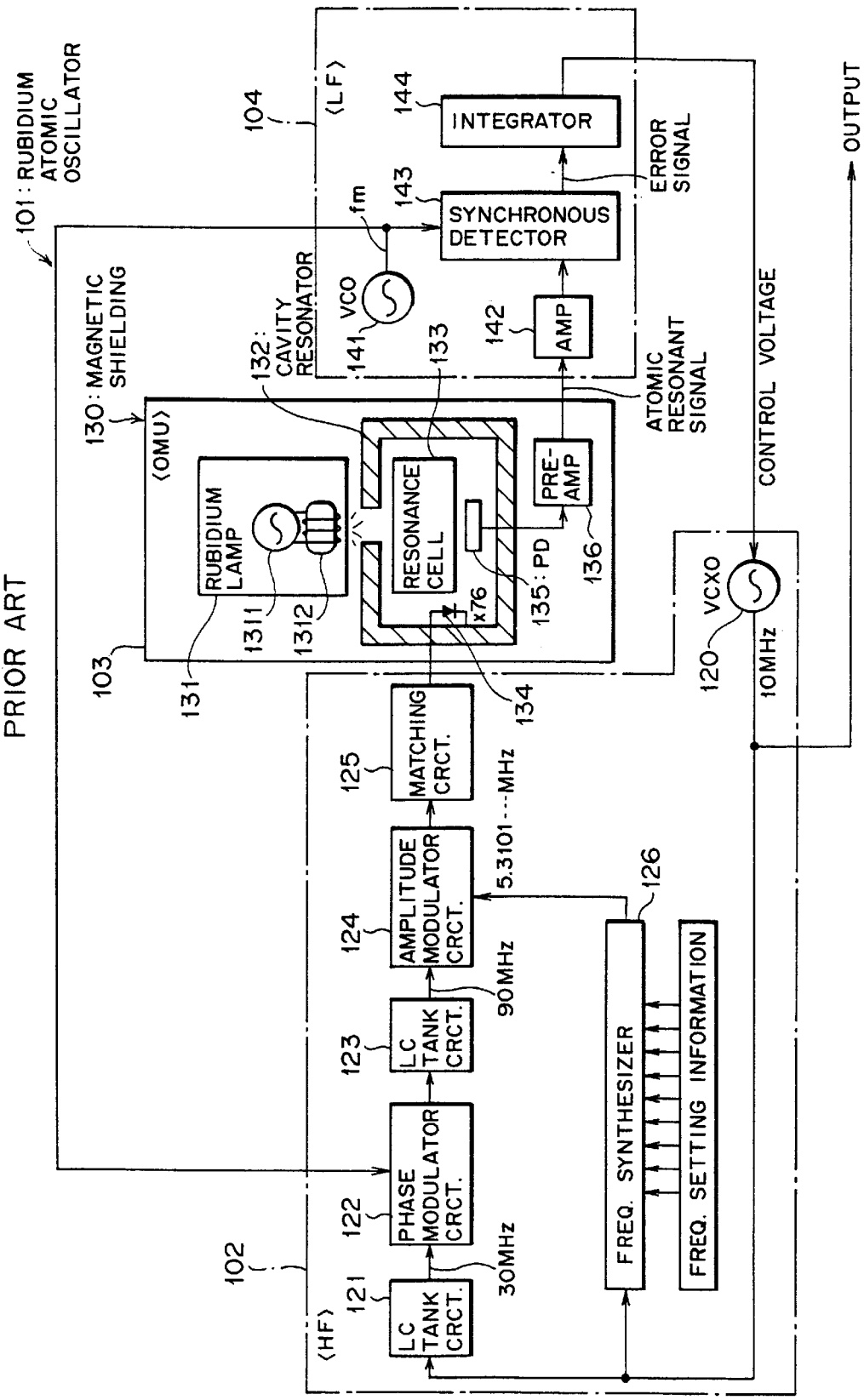
FIG. 6 is a block diagram schematically showing a prior art rubidium atomic oscillator.
Figure 7:
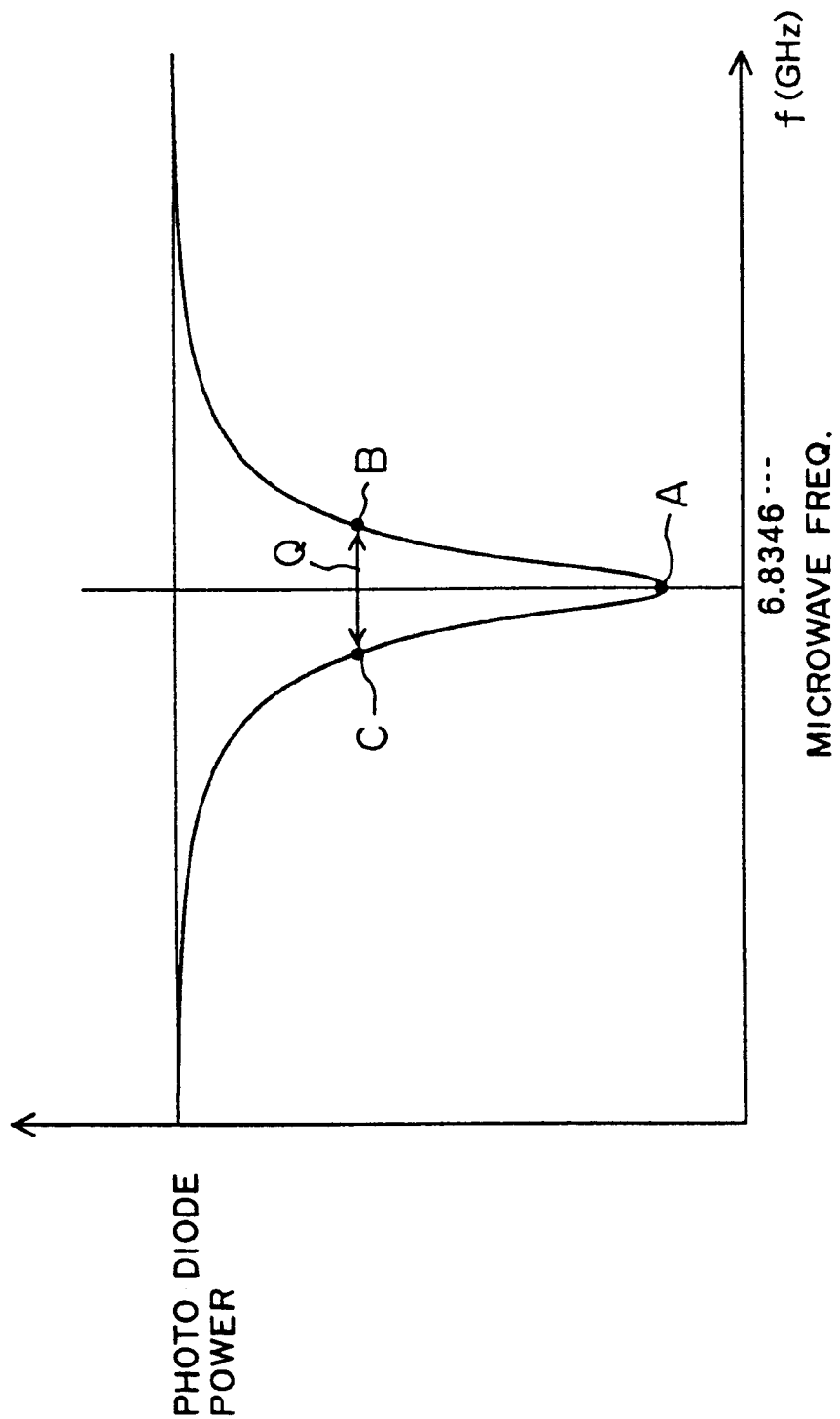
FIG. 7 is a graph illustrating how light emitted by a rubidium lamp is absorbed due to atomic resonance of a rubidium atom according to the prior art.
Figure 8:
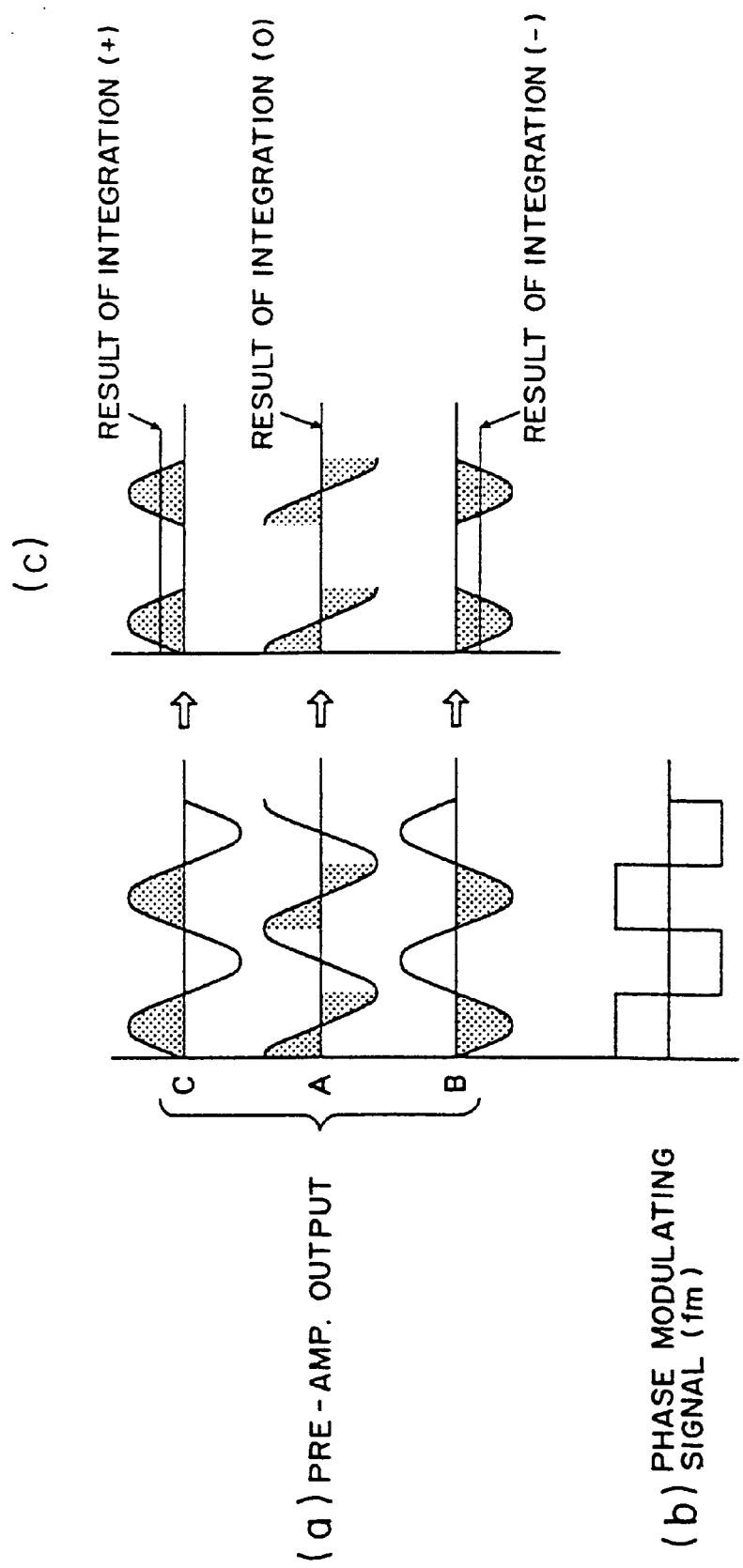
FIG. 8 is a graph illustrating a concept of detecting an error signal by synchronous detection according to the prior art.

The OMU 2, like the OMU shown in FIG. 6, includes: a rubidium lamp (light emitting lamp) 131, which has an exciter 1311 and a coil 1312; a cavity resonator 132 having a resonance cell 133, which is charged with a rubidium atom therein, and a photodiode (PD) 135 for receiving the light emitted from a rubidium lamp 131 and traveled through the resonance cell 133; and a pre-amplifier 136 for preliminarily amplifying a signal from PD 135 to output an atomic resonant signal. The varactor diode 134 described in connection with FIG. 6 does not constitute any part of the rubidium atomic oscillator of FIG. 2.

The LF block (synchronous detection section) 10, like the LF block shown in FIG. 6, includes a low-frequency oscillator (VCO) 141, an amplifier 142, a synchronous detector 143, and an integrator 144. The LF block serves as a servo circuit, which takes a synchronous detection on an atomic resonant signal output from the OMU 2 (pre-amplifier 136) with an output (phase modulation signal) of a low-frequency VCO 141 to thereby detect a difference {frequency-error information (error signal)} between the frequency of a microwave generated in the cavity resonator 132 and the resonant frequency (approximately 6.8346 GHz) of rubidium atom and then controls the output of a VCOX (voltage control crystal oscillator) 3 in such a manner that the detected error signal is minimal (ideally 0).

Meanwhile, the HF block 9 of the embodiment, unlike the HF clock shown in FIG. 6, includes a voltage-controlled crystal oscillator (VCXO) 3, a high-frequency PLL (phase-locked loop) circuit 4, an FET multiplier 5, a frequency divider (1/N) 6, a phase modulator 7, and an output synthesizer circuit 8. The high-frequency PLL circuit 4 has a high-frequency oscillator (VCO) 41, a frequency divider (1/M) 42, a phase comparator 43, low pass filter (LPF) 44. And the output synthesizer circuit 8 has a direct digital synthesizer (DDS) 81 and an LPF 82. N and M stand for natural numbers and satisfy the relation N<M.

The VCXO 3 also produces an output frequency $f_1$ to be supplied to outside; the output frequency $f_1$ is controlled such that an error signal (frequency-error information) of an atomic resonant signal from an OMU 2, which is detected by a synchronous detector 143 of the low-frequency block 10, is minimal. In the embodiment, assuming that a natural number used as a multiplier by an FET multiplier circuit 5 is P (P is a low natural number 3 or 4 as described below) and a resonant frequency (approximately 6.8346 GHz) of rubidium atom is $f_3$, the VCXO 3 produces an output frequency $f_1$ expressed by the following expression (1):

$$f_1=(f_3\times N)/(P\times M) \quad (1)$$

The frequency divider (1/N) (a first frequency divider) 6 (hereinafter also called the frequency divider 6) divides in frequency an output of the VCXO 3 by N to facilitate phase modulation of the phase modulator 7 at the downstream stage. On the output of the frequency divider (1/N) 6, the phase modulator 7 performs a phase modulation with a low-frequency phase modulation signal fm (155 Hz, for example), which is produced by a low-frequency VCO 141 of the LF 10 block, for a synchronous detection by a synchronous detection section 143.

Namely, the frequency divider (1/N) 6 and the phase modulator 7 constitute a frequency-dividing and modulating section, which divides in frequency the output of VCXO 3 and then modulates the resultant frequency by an output of the low-frequency VCO 141 (low-frequency modulation signal).

Further, in the high-frequency PLL circuit 4, the frequency divider (1/M) 42 (hereinafter also called simply the frequency divider 42) divides in frequency an output of the VCO 41 (frequency $f_2$) by M. As a result, the frequency (comparative frequency) of each of the signals (the output of the phase modulator 7 and that of the frequency divider 42), which is to be subject to phase comparison by the phase comparator 43, is adjusted to substantially the same value.

The phase comparator 43 takes a phase comparison between the comparing frequency of the output of VCO 41 and that of VCXO 3, whereupon the result of phase comparison by the phase comparator 43 is filtered by the loop filter (LPF) 44 to produce a control signal, which is to be output to the high-frequency VCO 41, to synchronize in phase the output of the high-frequency VCO 41 with that of the VCXO 3.

The output of the high-frequency VCO 41 is thereby synchronized in phase with that of the VCOX 3 and, at the same time, the output frequency $f_2$ equals to M/N times the output frequency of the VCXQ 3, $f_1=(f_3\times N)/(P\times M)$, namely, $f_3/P$, where M, N stand for the natural numbers used as dividers by the frequency dividers 6, 42, respectively.

In other words, the high-frequency PLL circuit 4 serves as a high-frequency conversion circuit which converts the output of the VCXO 3 into a high-frequency signal such that the high-frequency signal multiplied by a low natural number P equals to the resonant frequency $f_3$ of rubidium atom, frequency $f_2$ ($=f_3/P$) In the illustrated example, the high-frequency PLL circuit 4, the VCXO 3, and the frequency divider 6 constitute a frequency-multiplier and synthesizer circuit 11, in which the natural numbers N, M used by the frequency dividers 6, 42, respectively, are arbitrarily set, enabling a desired multiplication by M/N of the output frequency of the VCXO 3.

The FET multiplier (FET MULT: active, low-natural-number multiplier) 5 is an active multiplier circuit which has a non-illustrated amplifier utilizing a field-effect transistor (FET) and which multiplies the frequency of an input signal by using a high-frequency component, which has been produced with respect to the input signal by the amplifier.

The FET multiplier has a low natural number P as a multiplier by which the output of the high-frequency PLL circuit 4 {high-frequency signal: frequency $f_2$ (=$f_3$/P)} is multiplied to produce the resonant frequency signal of the rubidium atom (frequency $f_3$) (microwave to be input to a cavity resonator 132).

The output of the FET multiplier 5 is wirelessly coupled with the interior of the cavity resonator 132 by a desired coupling member (not shown) such as an antenna coupler so that the resonant frequency signal of rubidium atom can be directly produced inside the cavity resonator 132 without using a varactor diode 134 (see FIG. 6) having a high natural number as a multiplier such as "76" or "144" inside the cavity resonator 132 as conventional.

Further, the output synthesizer circuit (output frequency conversion section) 8 converts the output $f_1$ of the VCXO 3 into a desired output frequency of the rubidium atomic oscillator, thereby obtaining an oddless output frequency of the atomic oscillator of 5 or 10 MHz, for example, which is suitable for use as a standard source in broadcasting, a clock source in a digital synchronous network, etc.

Specifically, an arbitrary, oddless value of frequency wished as an output of the atomic oscillator is set in advance to a direct digital synthesizer (DDS) 81 as an output frequency setting data, and then the DDS 81 receives the output of VCXO 3 as a reference clock, thereby producing a frequency signal, which is synchronized in frequency with the reference clock, in accordance with the output frequency setting data. Considering that the output of the DDS 81 has a step-like waveform 83 as shown in FIG. 2, the waveform is shaped by a low pass filter (LPF) 82 into another waveform 84 in FIG. 2 as an output from the rubidium atomic oscillator 1.

The mode of operation of the rubidium atomic oscillator 1 of the foregoing embodiment will now be described naming specific numerical values.

Assuming that M=1536, N=63, P=3, the output frequency $f_1$ of VCXO 3, $f_1 \approx 93.443$ MHz, is obtained by the above-mentioned expression (1), and the output frequency $f_2$ of VCO 41 is 6.8346 . . . GHz/3≈2.2782 GHz.

The output of VCXO 3 is input to either of the frequency divider (1/63) 6 and the synthesizer circuit 8. The output of VCXO 3 input to the frequency divider (1/63) 6 is divided in frequency by 63 and is then input to the phase modulator 7 for being modulated in phase by the output of the low-frequency VCO 141 (phase modulation signal: 155 Hz).

The output signal of the phase modulator 7 is input as a reference signal of the high-frequency PLL circuit 4 to the phase comparator 43. The phase comparator 43 compares in phase the reference signal (93.443 MHz/63≈1.483 MHz) with the signal (2.2782 GHz/1536≈1.483 MHz) obtained by dividing in frequency the output of the high-frequency VCO 41 (2.2782 GHz) by 1536 in the frequency divider 42.

The output of the phase comparator 43 (phase error signal) is input to the LPF 44 to remove a high-frequency component and is then supplied to the high-frequency VCO 41 as a control voltage thereof. The output of the high-frequency 41 is synchronized in phase (locked) with the output of the VCXO 3 having been modulated in phase by the frequency that is 1536/63 times the output frequency of the VCXO 3 (93.443 MHz), namely approximately 2.2782 GHz.

The output of the high-frequency VCO 41 is then input into the FET multiplier circuit 5 for being multiplied by 3 to become the resonant frequency of rubidium atom (approximately 6.8346 GHz). The output of the FET multiplier circuit 5 is wirelessly coupled with the interior of the cavity resonator 132 through the coupling member, thereby producing inside the cavity resonator 132 the microwave to induce atomic resonance inside the resonance cell 133 (resonant frequency signal).

Subsequently, likewise the prior art described in connection with FIG. 6, the quantity of the light emitted from the rubidium lamp 131 and traveled through the resonance cell is detected, and then the OMU 2 outputs the atomic resonant signal having the frequency-error information between the microwave frequency and the resonant frequency of rubidium atom. The LF block 10 generates the control voltage of the VCXO 3 based on the atomic resonant signal, thereby stabilizing the output frequency of the VCXO 3 as highly as the degree of stability of the resonant frequency of rubidium atom.

In the meantime, the output (93.443 MHz) of VCXO 3 having been input to the output synthesizer circuit 8 is converted into an oddless frequency such as 10 MHz which is to be output from the rubidium atomic oscillator 1 by the DDS 81, based on the output frequency setting data. The resultant output is then subject to waveform shaping performed by the LPF 82 before being supplied to an external apparatus.

As described above, according to the rubidium atomic oscillator 1 of the present embodiment, the high-frequency PLL circuit 4 produces the high-frequency signal synchronized in phase highly stably with the output of the VCXO 3 in such a manner that the output frequency (of the VCXO 3) multiplied by a low natural number (3) coincides with the resonant frequency of rubidium atom, and the thus-made high frequency is then multiplied by 3 in the FET multiplier circuit 5 to produce the resonant frequency signal for the OMU 2 (cavity resonator 132). Therefore it is possible to convert the output frequency of the VCXO 3 into the resonant frequency of rubidium atom with precision without using a passive multiplier circuit such as an LC tank circuit or a varactor diode, which is expensive.

Accordingly it is unnecessary to use a matching circuit, which would be required in the prior art, and to make adjustments (tuning), such as impedance matching, between the low-natural-number multiplier circuit and the atomic resonator, thus realizing a tuning-free circuit. Also it is unnecessary to produce the resonant frequency of rubidium atom utilizing amplitude modulation as conventional. This results in downsizing of the atomic oscillator 1 and in reduction of the term and cost of manufacture, so that a more compact, inexpensive atomic oscillator 1 cab be manufactured in a shorter term.

Further, in the atomic oscillator 1 of the foregoing embodiment, because of the frequency divider 6 disposed upstream of the phase modulator 7, it is possible to perform the phase modulation on the output of the VCXO 3, which has been divided in frequency in advance to have a lower frequency, thus facilitating the phase modulation of the VCSO 3 with improved accuracy.

Furthermore, in the presence of the output synthesizer circuit 8 it is possible to convert the output frequency of the VCXO 3, which has been set to a value with some odds considering the resonant frequency of rubidium atom, into a desired oddless frequency, such as 10 MHz or 5 MHz, thus enabling the atomic oscillator 1 to output a required output frequency highly stably.

Alternatively a natural number (P) used as a multiplier by the FET multiplier circuit 5 may be "4". In such event, it suffices that the output frequency of the VCXO 3 $f_1$ is given by $f_1$=(6.8345 . . . GHz×63)/(4×1535)≈70.081 MHz, and also that the output frequency of the VCO 41 $f_2$ is given by $f_2$=6.8346 . . . GHz/4≈1.7087 GHz.

Thus, if the natural number "3" or "4" is used as a multiplier by the FET multiplier circuit 5, it is possible to have the FET multiplier 5 superior in multiplication characteristic as compared to other low natural numbers thus retaining loss of the output (high-frequency signal) of the high-frequency PLL circuit 4 at multiplication to the minimum. This gives a great contribution to improvement of performance of the atomic oscillator 1.

The natural number (P) used by the FET multiplier 5 should by no means be limited to "3" or "4"; an alternative natural number such as P=2, 5, 6, 7, 8, 9 (a single-digit natural number is preferred) may be used. Assuming that P=2, the output frequency $f_2$ of the high-frequency VCO 41 results in approximately 3.4173 GHz. And if P=5, the output frequency $f_2$ results in approximately 1.3669 GHz and if P=6, the output frequency $f_2$ results in approximately 1.1391 GHz. In other words, the natural number (P) takes a value of 2 to 6 for the output frequency $f_2$ falling in a range of 1 GHz through 4 GHz.

(C) Modification of the Embodiment

Figure 3:
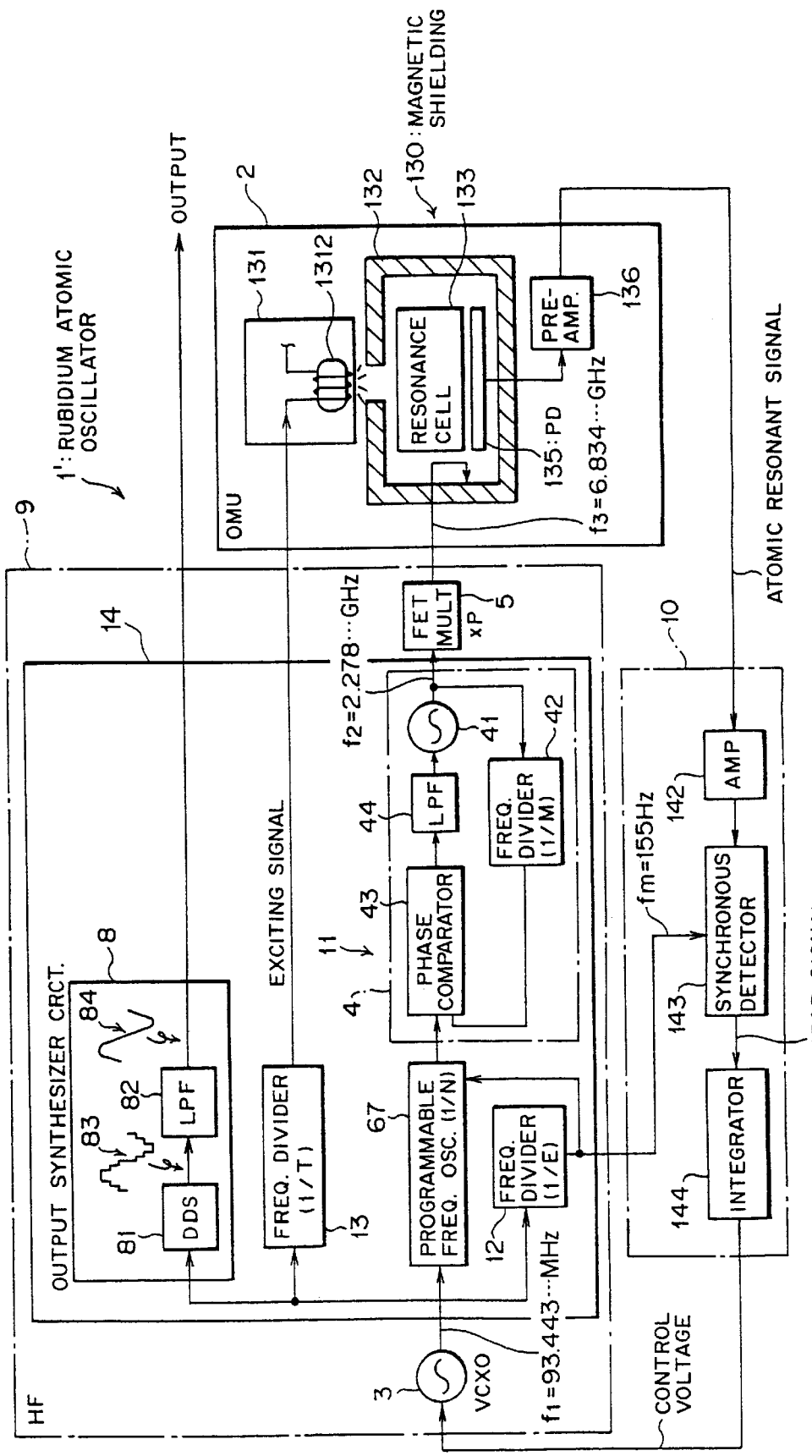
FIG. 3 is a block diagram schematically showing a modification of the rubidium atomic oscillator shown in FIG. 2.

FIG. 3 is a block diagram schematically showing a modification of the above-described rubidium atomic oscillator 1 of FIG. 2. The modified atomic oscillator 1' of FIG. 3 differs from that of FIG. 2 in that in place of the frequency divider (1/N) 6 and the phase modulator 7, a programmable frequency divider 67 is provided in the HF clock 9, there being added a frequency divider (1/E) 12 and a frequency divider (1/T) 13 (where E and T are natural numbers satisfying T>E).

The frequency divider (1/E) (a second frequency divider) 12 (hereafter also called simply "frequency divider 12") divides in frequency the output of the VCXO 3 by E to produce the low-frequency phase modulation signal, which is produced by the low-frequency VCO 141 of the atomic oscillator 1 of FIG. 2, making it unnecessary to use the low-frequency VCO 141 in the LF block 10. In this modification, likewise the above-mentioned embodiment, assuming that the output frequency of the VCXO 3 $f_1$ is approximately 93.443 MHz and the frequency of the phase modulation signal is 155 Hz, the numerical value E as a divisor will be approximately 602,858.

Further, the frequency divider (1/T) (a third frequency divider) 13 (hereinafter also called simply as "frequency divider 13") divides in frequency the output of the VCXO 3 by T to produce an exciting signal (drive signal) for the rubidium lamp 131 in the OMU 2, thus making it unnecessary to use the exciter 1311. In general, the frequency of the exciting signal for the rubidium lamp 131 is around 50 MHz; assuming that the output frequency of the VCXO 3 $f_1$ is approximately 93.443 MHz, the numerical value T as a divisor will be 2.

Furthermore, the programmable frequency divider 67 (hereinafter also called simply as "frequency divider 67") serves as both the frequency divider (1/N) 6 and the phase modulator 7 (frequency-dividing and modulating section). Practically, if one cycle of the output frequency of the VCXO 3 $f_1$ is defined as 1 bit (10 nsec in case of 100 MHz), it is possible to take 1/N frequency division and phase modulation on the output of the VCXO 3 by bit addition and bit subtraction on a frequency-divided clock of the VCXO 3, which has been divided by N, depending on the phase modulation frequency {the output of the frequency divider (1/E) 12}.

Figure 4:
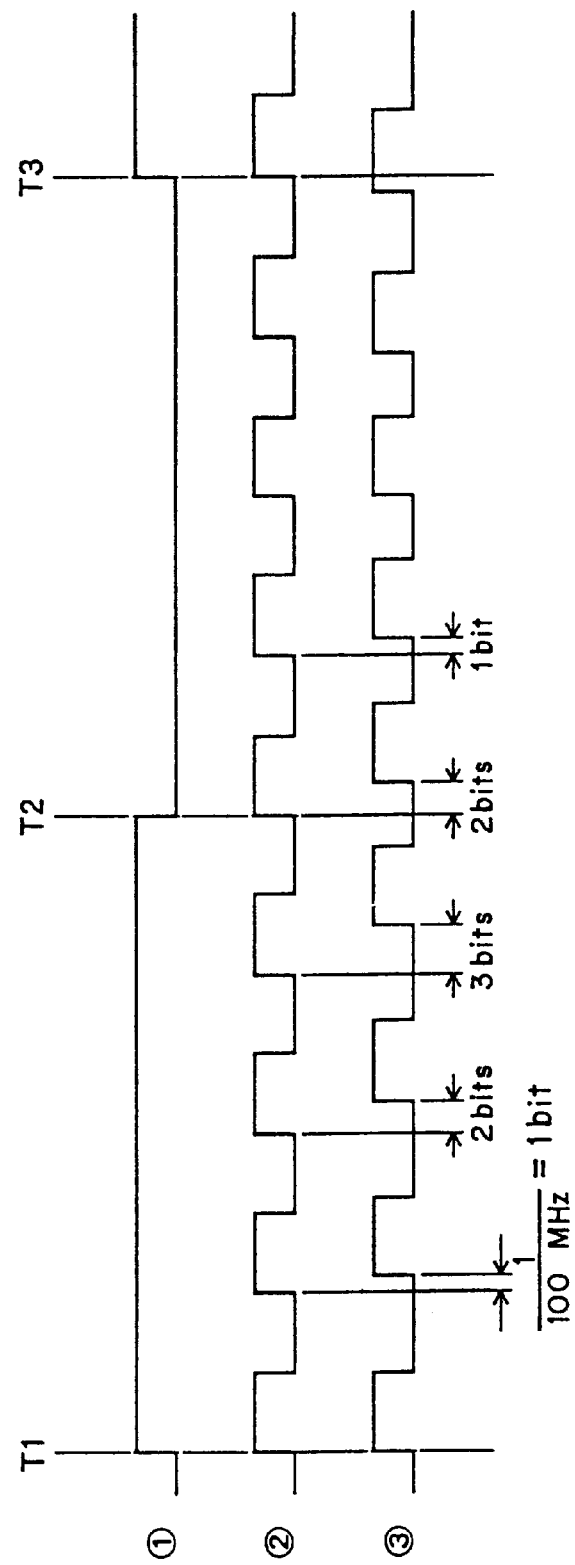
FIG. 4 is a time chart indicating the mode of operation of a programmable frequency divider shown in FIG. 3.

For conciseness, assume that the output frequency of VCXO 3 $f_1$ is 100 MHz and the comparative frequency of the high-frequency PLL circuit is 10 MHz (i.e., the natural number as a divisor is N=10). In the programmable frequency divider 67, as shown in FIG. 4, one bit is added to every clock (frequency-dividing clock) of the frequency signal, which has been obtained by dividing the output frequency of VCXO 3 $f_1$ (②) by 10 while the phase modulation signal {the output of the frequency divider (1/E) 12: ①}keeps in a H(high) level (see time points T1 to T2), causing the rise of the output (③) to delay for one bit. To the contrary, while the phase modulation signal (①) is kept in a L(low) level (see time points T2 to T3), one bit is subtracted from every clock of the frequency signal (②), causing the rise of the output (③) to hasten for one bit.

This digital change in phase at a rise or fall of the frequency-divided clock (②) allows the output of the VCXO 3 to be divided in frequency by N and modulated in phase. In FIG. 4, a one-bit operation (addition and subtraction) is performed simply at every cycle of the frequency-divided clock (②). To increase the degree of modulation, a 2-bit or higher-bit operation should be performed at every cycle. And to decrease the degree of modulation, a 1-bit operation should be performed at every two or more cycles. The setting of these bit-operations, namely, the setting of natural number by which the frequency is divided and the degree of phase modulation is executed by a program which is set from an external source.

In short, the programmable frequency divider 67 changes the (frequency-divided) clock cycle of the output frequency of the VCXO 3 $f_1$ in accordance with the clock cycle of the low-frequency phase modulation signal based on the program set from outside to divide in frequency and modulate in phase the output of the VCXO 3. Even in the present modified example, this programmable frequency divider 67, the high-frequency PLL circuit 4, and the VCXO 3 jointly constitute the frequency multiplier and synthesizer circuit 11.

Accordingly, it is unnecessary to employ the frequency divider 6 and the phase modulator 7 in the atomic oscillator 1 of FIG. 2 and it is possible to obtain the same advantageous results as those of the atomic oscillator 1 of FIG.2, thus reducing the size of circuit of the HF block 9 and downsizing the atomic oscillator 1'.

Further, in this modified example, since the frequency divider (1/E) 12 produces the phase modulation signal from the output of the VCXO 3, the above-mentioned low-frequency VCO 141, would be needless, further reducing the size of the circuit. Also since the output of the VCXO 3 is stabilized as highly as the degree of stability of the resonant frequency of rubidium atom, it is possible to produce a highly stable phase-modulation signal so that an error signal can be detected with stability by the synchronous detector 143, thus stabilizing the output of the VCXO 3 further.

Furthermore, in this modified example, since the frequency divider (1/T) 13 also produces from the output of the VCXO 3 the exciting signal for a rubidium lamp 131, it is unnecessary to employ an exciter 1311, reducing the size of the rubidium lamp 13 and hence stabilizing the light emitting condition.

Generally in a rubidium atomic oscillator, because the resonant frequency (6.8346 GHz) is produced (converted) from the output (basic frequency) of an oscillator (corresponding to the VCXO 3) having a lower frequency compared to the resonant frequency of rubidium atom (6.8346 GHz). Electric waves of various frequencies are produced in the middle of the conversion so that an electric wave identical in frequency with the resonant frequency of 6.8346 GHz is occasionally produced by accident. This unnecessary wave can be a cause for abnormal operations.

In particular, an unnecessary wave, which is decided by the frequency of an exciting signal (hereafter called exciting frequency) and a multiplied basic frequency, largely depends on the exciting frequency. As this the exciting frequency is produced independently of the VCXO 3 by the exciter 1311, likewise in the atomic oscillator 1 of FIG. 2, it can occasionally coincide with the resonant frequency of rubidium atom because of a poor stability of the exciting frequency, resulting in a spurious emission due to the exciting frequency and the basic frequency.

Given that the exciting frequency is produced from the output of the VCXO 3 as described above, it would be possible to identify the unnecessary spurious frequency to prevent the production of a frequency identical with the resonant frequency of rubidium atom on a design basis, thereby providing a high-performance rubidium atomic oscillator 1'.

Partly because of the individual frequency dividers 12, 13, 42, 67 of this modified example can be manufactured as an integrated circuit (IC) in the same process, and partly since the phase comparator 43 of the high-frequency PLL circuit 4 can be constructed in an ordinary PLL-IC structure, it is possible to design the frequency dividers 12, 13, 42, 46 and the phase comparator 43 of the high-frequency PLL circuit 4 in the same process. The output synthesizer circuit 8 also can be manufactured as an IC in the same process.

Figure 5:
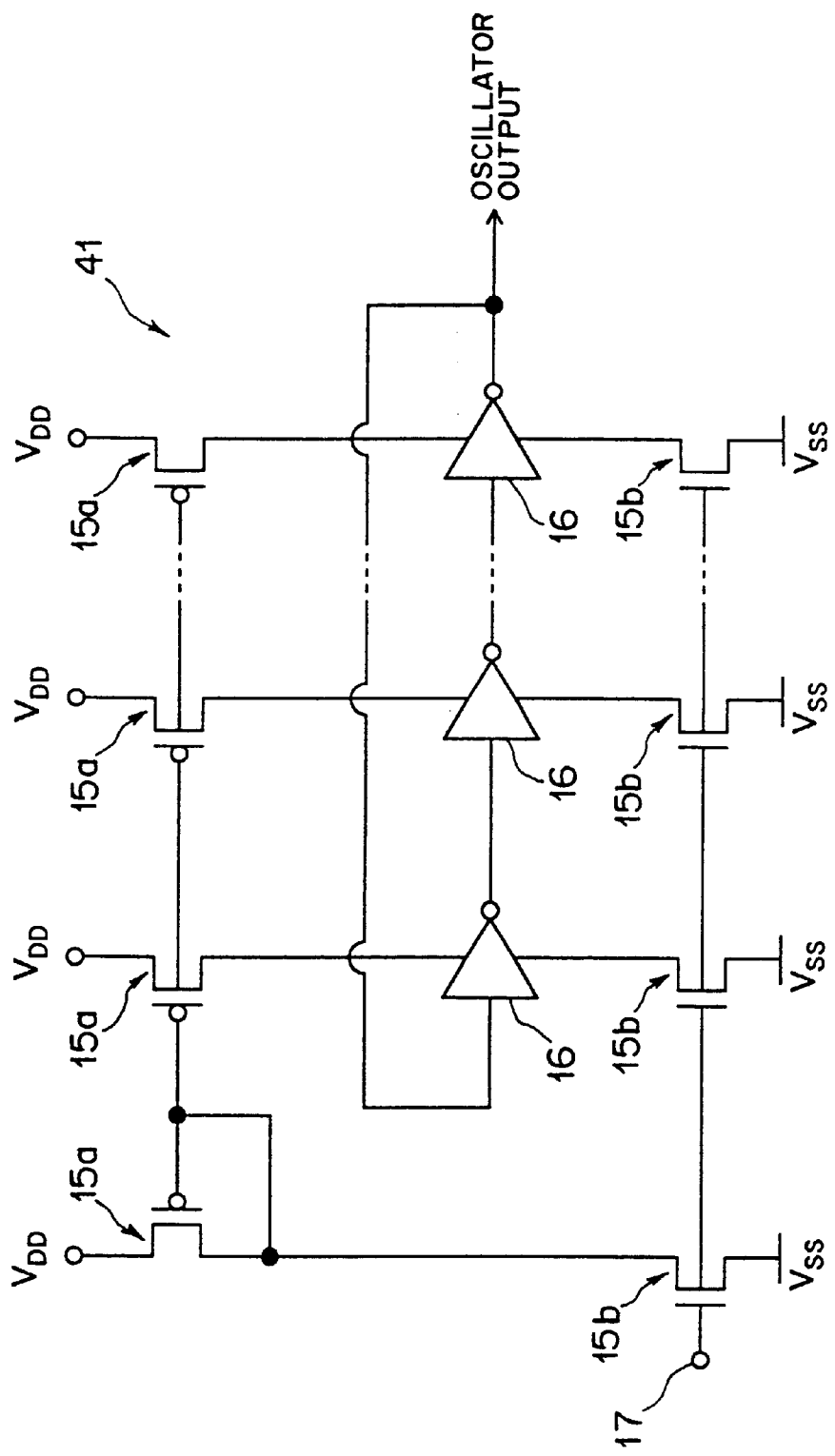
FIG. 5 is a circuit diagram showing an example (ring oscillator) of high-frequency VCO shown in FIG. 3.

Further, the high-frequency VCO 41 also can be manufactured as an IC by constituting it as a microstrip-line oscillator, or a ring oscillator as shown in FIG. 5, for example, in which FETs 15a, 15b and inverter elements 16 are provided, by a number suitable for producing a required output frequency, with the individual inverter elements 16 coupled in series with each other to delay generation of the output frequency of the output signal. In FIG. 5, VDD designates a power terminal; VSS, a ground (GND) terminal; and 17, a voltage terminal for adjusting an oscillation frequency of the ring oscillator.

Furthermore, regarding the LPF 42, since the output frequency of VCXO 3 $f_1$ is stable and sufficiently high as compared to the cut-off frequency of the LPF 42, it is possible to use a digital filter {a finite impulse response (FIR) filter or an infinite impulse response (IIR) filter, etc. }, in which a cut-off frequency synchronized with the output frequency of the VCXO 3 can be set.

It is understood from the foregoing description that various parts or elements enclosed by a rectangular frame 14 in FIG. 3 can be constructed in a single chip of large-scale integrated circuit (LSI) realizing microminiaturization of the HF block 9 and thus making it possible to manufacture a thoroughly small-sized, inexpensive atomic oscillator in a short term.

In this modified example, both the frequency divider 12 for producing the phase-modulation signal and the frequency divider 13 for producing the exciting signal are employed. Alternatively, at least one of them may be omitted (namely, only the programmable frequency divider 67 is applied to the atomic oscillator 1 of FIG. 2).

In another alternative, the frequency divider 12 and/or the frequency divider 13 may be applied to the atomic oscillator 1 of FIG. 2, obtaining the same operations and results as the modified example.

(D) Other Modifications

In the above-mentioned embodiment and its modification, the high-frequency PLL circuit 4 including the high-frequency VCO 41 is used to convert the output frequency of VCXO 3 $f_1$ into the resonant frequency of rubidium atom. Alternatively a plurality of FET multipliers 5 coupled in steps may be used. In this alternative form, however, the more the FET multipliers 5, the more the number of steps would increase, not only increasing the size of circuit but also impairing the characteristic. Thus as mentioned above, with the use of a high-frequency PLL circuit 4, it is possible to obtain a highly-stable resonant frequency, hence realizing a high-performance atomic oscillator 1 (1').

If the output frequency of the rubidium atomic oscillator 1 (1') may be some odds, the output synthesizing circuit 8 may be omitted. Also the construction of each of the OMU 2 and LF block 10 should by no means be limited to that of FIG. 2 or FIG. 3, as long as an atomic resonant frequency can be obtained anyway and then the output frequency $f_1$ of the VCXO 3 can be controlled and stabilized based on the obtained atomic resonant frequency.

In the foregoing examples, the present invention is applied to a rubidium atomic oscillator, using a rubidium atom. However, the present invention should by no means be limited to these illustrated examples and may be applied to other types of oscillators such as a cesium atomic oscillator using a cesium atom.

Also, the present invention should by no means be limited to the illustrated examples, and various other changes or modifications may be suggested without departing the gist of the inventive concept.

What is claimed is:

1. An atomic oscillator comprising:
    (a) an atomic resonator having a desired atom for outputting an atomic resonant signal having frequency-error information in response to a resonant frequency signal which causes the atom to resonate;
    (b) a standard oscillator for producing an output frequency to be supplied to outside as the output of said atomic oscillator, said output frequency being controlled in such a manner that said frequency-error information of said atomic resonant signal is minimal;
    (c) a high-frequency converting circuit for at least phase-modulating the output of said standard oscillator so as to convert the output of said standard oscillator into a high frequency signal such that said high frequency signal multiplied by a predetermined low natural number equals to said resonant frequency signal;
    (d) an active, low-integral-number multiplier for producing said resonant frequency signal, which is to be input to said atomic resonator, by actively multiplying said high frequency signal from said high-frequency converting circuit by said low natural number; and
    (e) an output synthesizer circuit for receiving the output, which is a signal prior to the phase-modulating in said high-frequency converting circuit, of said standard oscillator and adjusting the frequency of the received output based on frequency setting data.

2. An atomic oscillator according to claim 1, further comprising an output frequency converting section for converting said output frequency of said standard oscillator into a desired output frequency to be output from said atomic resonator.

3. An atomic oscillator according to claim 1, wherein said low natural number is 3 or 4.

4. An atomic oscillator according to claim 2, wherein said low natural number is 3 or 4.

5. An atomic oscillator according to claim 1, wherein said high-frequency converting circuit is a high-frequency phase-looked loop (PLL) circuit including:
    a high frequency oscillator for producing said high frequency signal;
    a phase comparator for comparing the output of said high frequency oscillator in phase with that of said standard oscillator; and a loop filter for producing a control signal to be output to said high frequency oscillator, said control signal serving to filter the result of phase comparison of said phase comparator and to thereby synchronize the output of said high frequency oscillator in phase with that of said standard oscillator.

6. An atomic oscillator according to claim 2, wherein said high-frequency converting circuit is a high-frequency phase-looked loop (PLL) circuit including:

a high frequency oscillator for producing said high frequency signal;

a phase comparator for comparing the output of said high frequency oscillator in phase with that of said standard oscillator; and a loop filter for producing a control signal to be output to said high frequency oscillator, said control signal serving to filter the result of phase comparison of said phase comparator and to thereby synchronize the output of said high frequency oscillator in phase with that of said standard oscillator.

7. An atomic oscillator according to claim 3, wherein said high-frequency converting circuit is a high-frequency phase-looked loop (PLL) circuit including:

a high frequency oscillator for producing said high frequency signal;

a phase comparator for comparing the output of said high frequency oscillator in phase with that of said standard oscillator; and a loop filter for producing a control signal to be output to said high frequency oscillator, said control signal serving to filter the result of phase comparison of said phase comparator and to thereby synchronize the output of said high frequency oscillator in phase with that of said standard oscillator.

8. An atomic oscillator according to claim 4, wherein said high-frequency converting circuit is a high-frequency phase-looked loop (PLL) circuit including:

a high frequency oscillator for producing said high frequency signal;

a phase comparator for comparing the output of said high frequency oscillator in phase with that of said standard oscillator; and a loop filter for producing a control signal to be output to said high frequency oscillator, said control signal serving to filter the result of phase comparison of said phase comparator and to thereby synchronize the output of said high frequency oscillator in phase with that of said standard oscillator.

9. An atomic oscillator according to claim 1, further comprising:

a frequency-dividing and modulating section for dividing in frequency the output of said standard oscillator and modulating the resultant output of said standard oscillator by a predetermined low-frequency modulation signal; and a synchronous detecting section for obtaining said frequency-error information by performing a synchronous detection on said atomic resonant signal using said low-frequency modulation signal and thereby producing a control signal to control said output frequency, which is to be produced from said standard oscillator.

10. An atomic oscillator according to claim 9, wherein said frequency-dividing and modulating section includes:

a first frequency divider for dividing in frequency the output of said standard oscillator; and a phase modulator for modulating in phase the output of said first frequency divider by said low-frequency modulation signal.

11. An atomic oscillator according to claim 9, wherein said frequency-dividing and modulating section includes a programmable frequency divider for dividing in frequency and modulating in phase the output of said standard oscillator by varying a clock cycle of said output frequency of said standard oscillator in accordance with the clock cycle of said low-frequency modulation signal based on a program set from outside said atomic oscillator.

12. An atomic oscillator according to claim 9, further comprising a second frequency divider for dividing in frequency the output of said standard oscillator to produce said low-frequency modulation signal.

13. An atomic oscillator according to claim 10, further comprising a second frequency divider for dividing in frequency the output of said standard oscillator to produce said low-frequency modulation signal.

14. An atomic oscillator according to claim 11, further comprising a second frequency divider for dividing in frequency the output of said standard oscillator to produce said low-frequency modulation signal.

15. An atomic oscillator according to claim 1, further comprising:

a light emitting lamp for irradiating light to said atom in said atomic resonator; and a third frequency divider for dividing in frequency the output of said standard oscillator to produce a drive signal driving said light emitting lamp.

16. An atomic oscillator according to claim 5, wherein said high frequency oscillator of said high-frequency PLL circuit is a ring oscillator.

17. An atomic oscillator according to claim, wherein said loop filer of said high-frequency PLL circuit is a digital filter.

18. An atomic oscillator according to claim 16, wherein said loop filter of said high-frequency PLL circuit is a digital filter.

19. An atomic oscillator according to claim 6, wherein said high frequency oscillator of said high-frequency PLL circuit is a ring oscillator.

20. An atomic oscillator according to claim 6, wherein said loop filer of said high-frequency PLL circuit is a digital filter.

21. An atomic oscillator according to claim 19, wherein said loop filer of said high-frequency PLL circuit is a digital filter.

22. An atomic oscillator according to claim 7, wherein said high frequency oscillator of said high-frequency PLL circuit is a ring oscillator.

23. An atomic oscillator according to claim 7, wherein said loop filer of said high-frequency PLL circuit is a digital filter.

24. An atomic oscillator according to claim 22, wherein said loop filer of said high-frequency PLL circuit is a digital filter.

25. An atomic oscillator according to claim 8, wherein said high frequency oscillator of said high-frequency PLL circuit is a ring oscillator.

26. An atomic oscillator according to claim 8, wherein said loop filer of said high-frequency PLL circuit is a digital filter.

27. An atomic oscillator according to claim 25, wherein said loop filer of said high-frequency PLL circuit is a digital filter.

* * * * *